(12) United States Patent
Pocza et al.

(10) Patent No.: US 9,347,563 B2
(45) Date of Patent: May 24, 2016

(54) GAS LOCK, AND COATING APPARATUS COMPRISING A GAS LOCK

(75) Inventors: David Pocza, Freiburg (DE); Stefan Reber, Gundelfingen (DE); Martin Arnold, Gundelfingen (DE); Norbert Schillinger, Ihringen (DE)

(73) Assignee: FRAUHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 264 days.

(21) Appl. No.: 13/881,068

(22) PCT Filed: Oct. 20, 2011

(86) PCT No.: PCT/EP2011/005289
§ 371 (c)(1),
(2), (4) Date: Jul. 11, 2013

(87) PCT Pub. No.: WO2012/055510
PCT Pub. Date: May 3, 2012

(65) Prior Publication Data
US 2013/0291949 A1 Nov. 7, 2013

(30) Foreign Application Priority Data
Oct. 27, 2010 (DE) .......................... 10 2010 049 837

(51) Int. Cl.
*F16K 11/20* (2006.01)
*F16J 15/14* (2006.01)
(Continued)

(52) U.S. Cl.
CPC ................. *F16J 15/14* (2013.01); *C23C 14/56* (2013.01); *C23C 16/45506* (2013.01); *C23C 16/45589* (2013.01); *C23C 16/45591* (2013.01);
(Continued)

(58) Field of Classification Search
CPC C23C 16/45506; C23C 16/52; C23C 16/545; F16J 15/14
USPC ................... 137/597, 803, 833; 118/718, 719
See application file for complete search history.

(56) References Cited

U.S. PATENT DOCUMENTS

| 4,285,668 A | 8/1981 | Pepe |
| 4,438,724 A | 3/1984 | Doehler et al. |

(Continued)

FOREIGN PATENT DOCUMENTS

DE 3050805 C1 3/1985

OTHER PUBLICATIONS

The International Search Report and the Written Opinion issued in connection with PCT Application No. PCT/EP2011/005289 mailed on Feb. 24, 2012.

(Continued)

*Primary Examiner* — John K Fristoe, Jr.
*Assistant Examiner* — Reinaldo Sanchez-Medina
(74) *Attorney, Agent, or Firm* — Gesmer Updegrove LLP

(57) ABSTRACT

The present invention relates to a gas lock for separating two gas chambers, which while taking up minimal space makes it possible to achieve the separation of gases without contact with the product/educt/transporting system. The gas lock according to the invention is distinguished in that at least one means for manipulation of the flow is present in a flow passage of the gas lock. Also, the present invention relates to a coating device which comprises a gas lock according to the invention. Also provided are possibilities for using the gas lock according to the invention.

11 Claims, 16 Drawing Sheets

Figure 1:
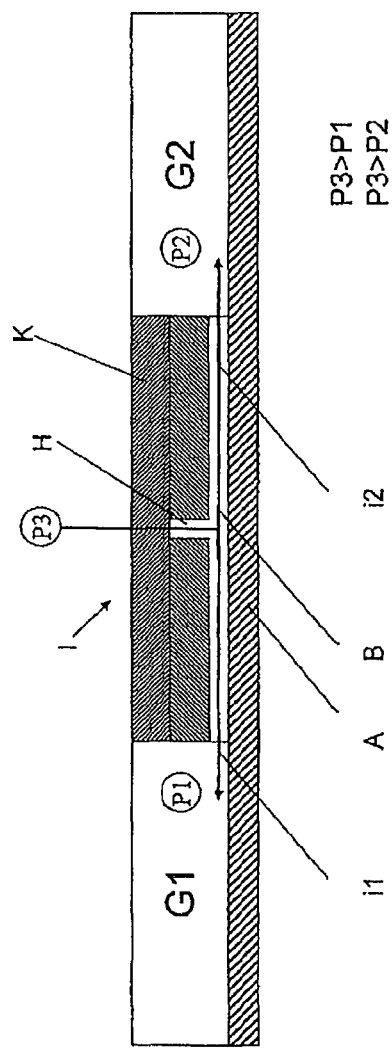

(51) Int. Cl.
*C23C 14/56* (2006.01)
*C23C 16/455* (2006.01)
*C23C 16/52* (2006.01)
*C23C 16/54* (2006.01)

(52) U.S. Cl.
CPC ............... *C23C16/52* (2013.01); *C23C 16/54* (2013.01); *Y10T 137/0318* (2015.04); *Y10T 137/2224* (2015.04)

(56) References Cited

U.S. PATENT DOCUMENTS

| | | | |
|---|---|---|---|
| 5,065,696 A | * | 11/1991 | Greenberg et al. ........... 118/718 |
| 5,443,860 A | | 8/1995 | Wilkinson |
| 5,919,310 A | | 7/1999 | Fujioka et al. |
| 5,997,963 A | * | 12/1999 | Davison .................. C23C 16/44 118/722 |
| 2002/0066409 A1 | * | 6/2002 | Brun ............................ 118/715 |
| 2009/0242036 A1 | * | 10/2009 | Kolodner et al. ............... 137/13 |

OTHER PUBLICATIONS

The International Preliminary Report on Patentability issued on May 10, 2013, issued in connection with PCT Application No. PCT/EP2011/005289.

* cited by examiner

Figure 1 - Prior Art

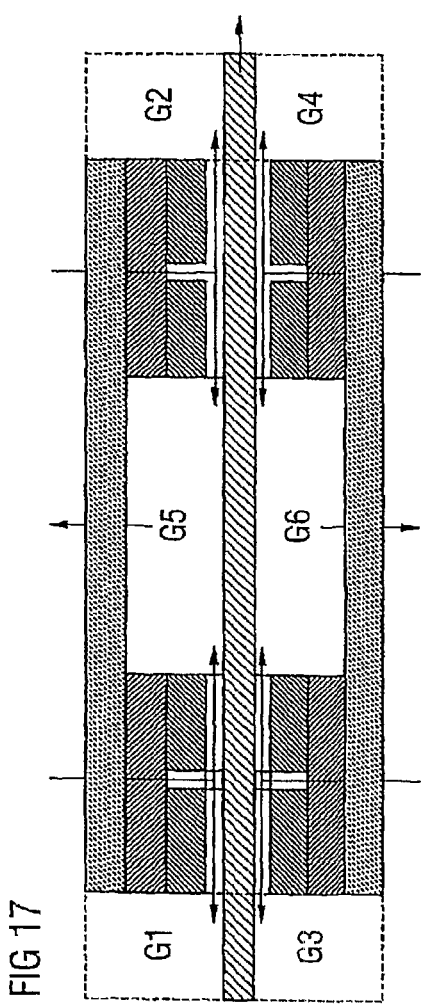

GAS LOCK, AND COATING APPARATUS COMPRISING A GAS LOCK

PRIORITY INFORMATION

The present invention is a 371 National Phase Application of PCT/EP2011/005289, filed on Oct. 20, 2011 that claims priority to German Application No. 102010049837.8 filed on Oct. 27, 2010, which are incorporated herein by reference in their entireties.

BACKGROUND OF THE INVENTION

The present invention relates to a gas lock for separating two gas chambers, which while taking up minimal space makes it possible to achieve the separation of gases without contact with the product/educt/transporting system. The gas lock according to the invention is distinguished in that at least one means for manipulation of the flow is present in a flow passage of the gas lock. Also, the present invention relates to a coating device which comprises a gas lock according to the invention. Also provided are possibilities for using the gas lock according to the invention.

To reduce costs, coating plants are designed with the aim of creating continuous educt and product flows. In many fields, however, the separation of the process gases in the plant and the separation of the environment from the process gases represent a problem.

In the case of continuous plants, which have to dispense with conventional sealing concepts, essentially the following difficulties arise:
a) Intermixing of gases from different process steps has to be precluded since this would render the product unusable (for example the layer structure may be significantly influenced and the product destroyed).
b) The mostly toxic and/or explosive process gases have to be reliably separated from the environment in order to avoid safety risks (poisoning and explosions).
c) The separation of the gases has to be detectable without having to measure the pressure in toxic and/or explosive gases. A failure of the sealing concept can therefore be detected before the process gases are intermixed or flow out of the plant (interruptions in the process destroy the product, and explosion-proof devices represent an enormous cost factor in plant construction and are avoided).
d) The concept has to be kept spatially compact in order to design the plants in an economical manner.
e) The concept must not generate any wear so as to keep the up-time of the plant as high as possible and so as not to damage the products (no mechanical contact with the transporting system or with the product).

Up to now, the aforesaid set of problems has been solved by conventional sealing of the gas chambers by using gastight chambers (by means of mechanical seals). This, however, leads to the transporting system not being able to function continuously and to there being the risk of wear or damage (see point e)).

Another possibility is the use of gas sprays. In this case, however, there is the problem that in the currently standard forms these are too undirected and do not create sufficiently tolerant and economical gas separation for high-purity processes. This leads to the aforesaid problems a), b) and c) and to lower up-time of the plant.

BRIEF DESCRIPTION OF THE ILLUSTRATED EMBODIMENTS

Figure 2:
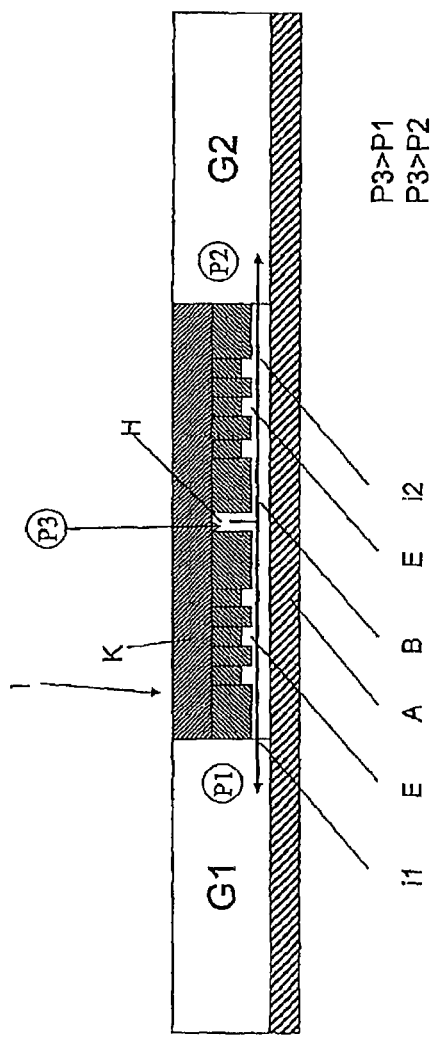
Figure 3:
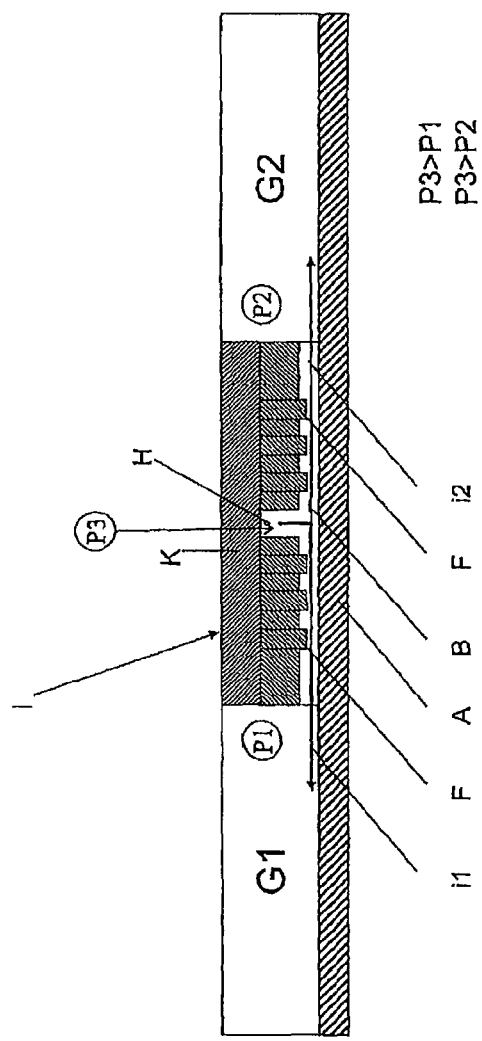
Figure 4:
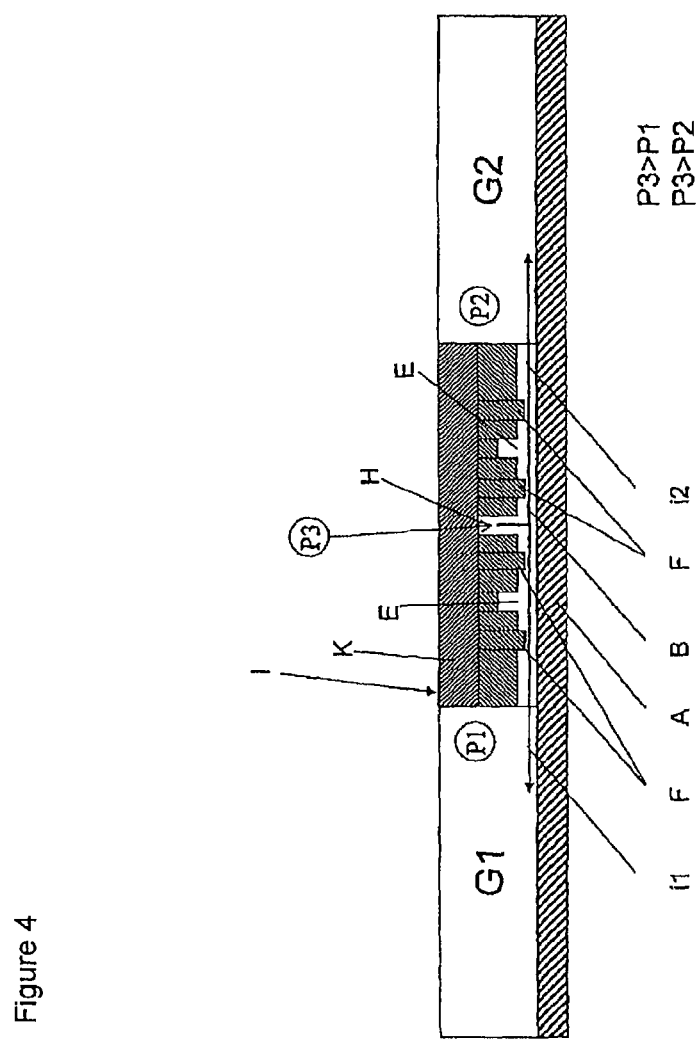
Figure 5:
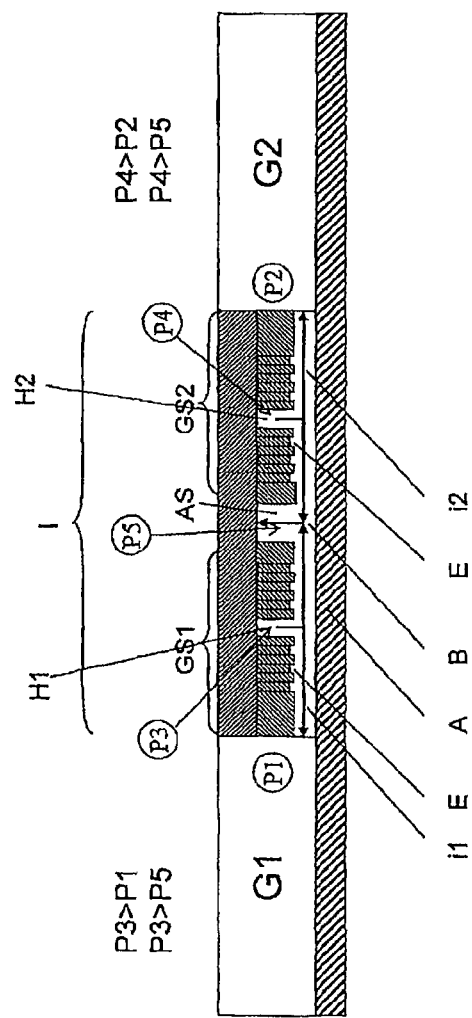
Figure 6:
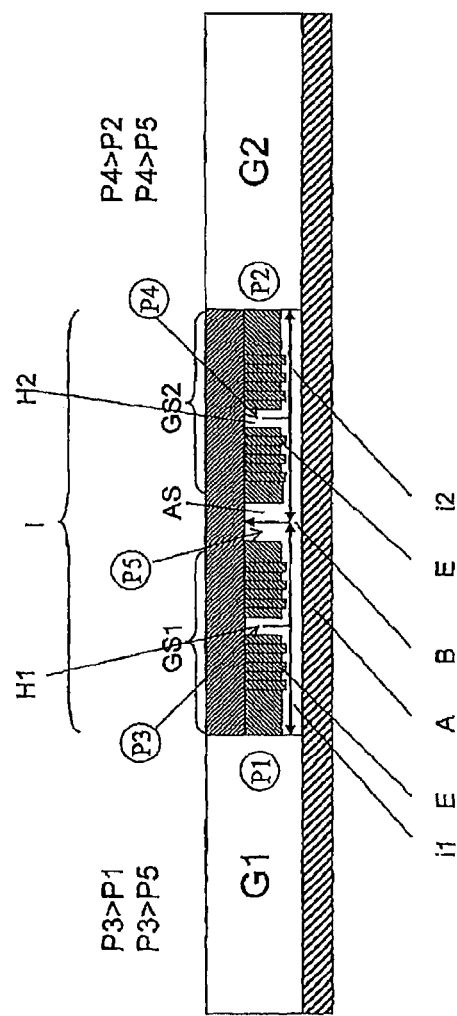
Figure 7:
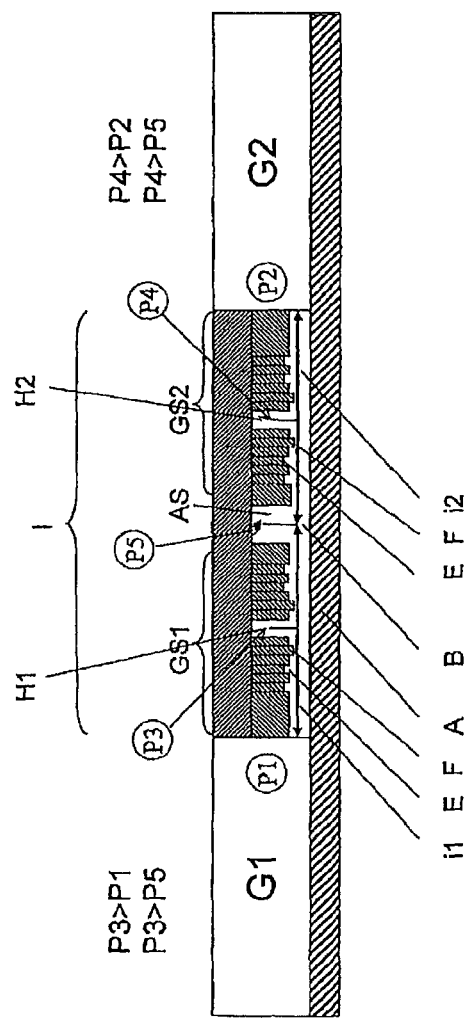
Figure 8:
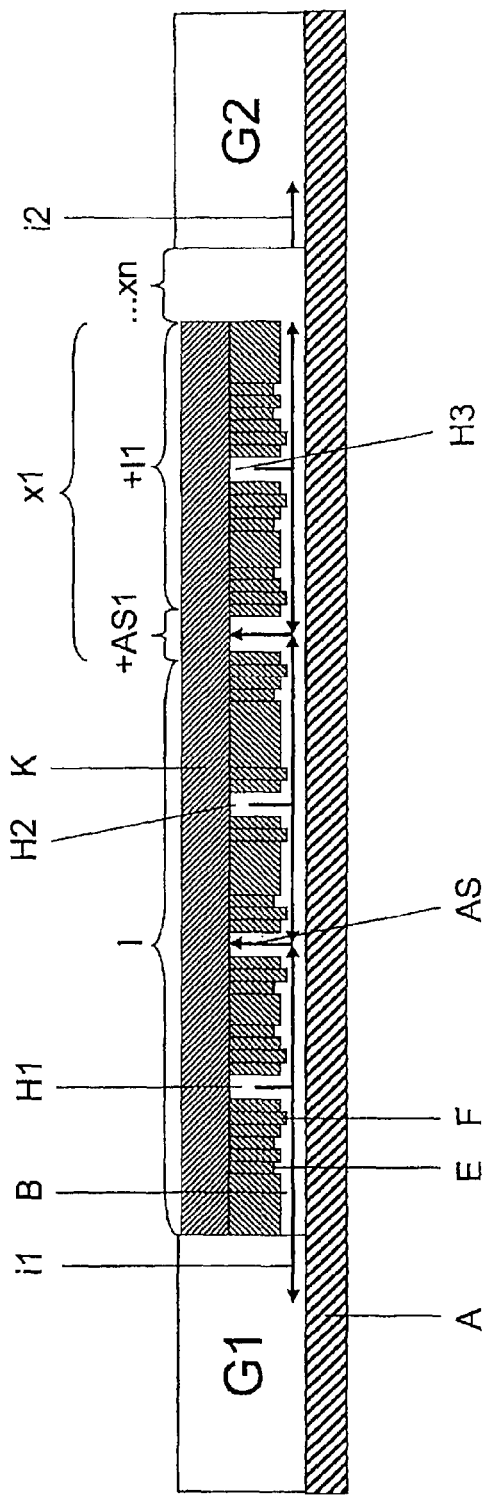
Figure 9:
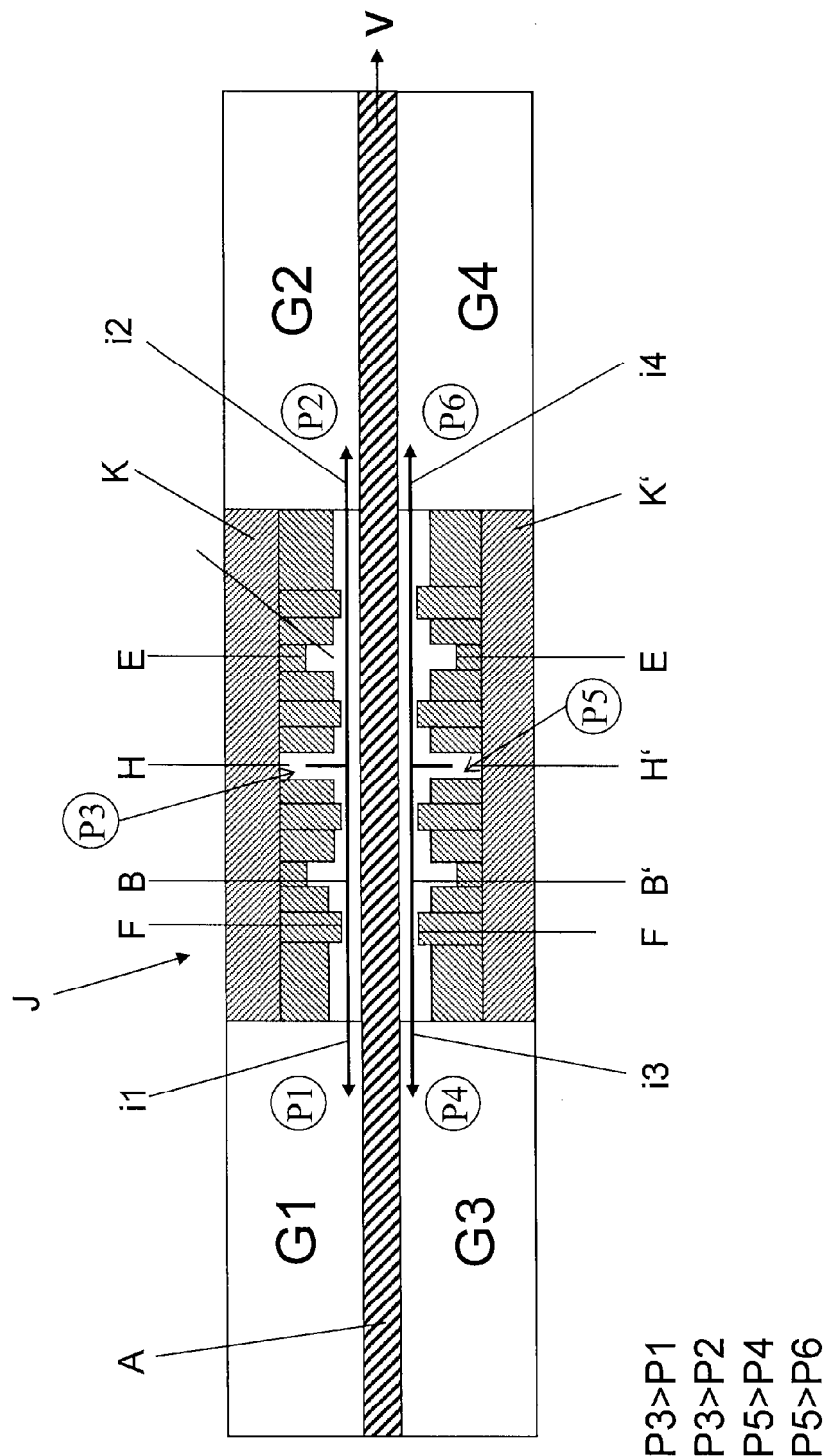
Figure 10:
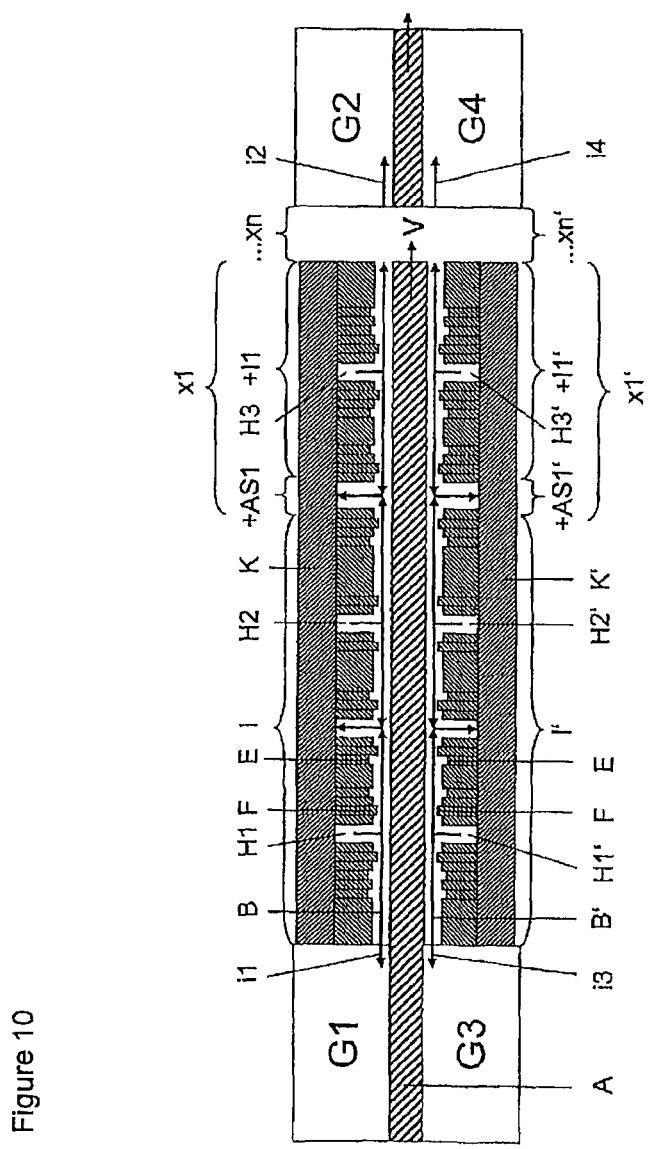
Figure 11:
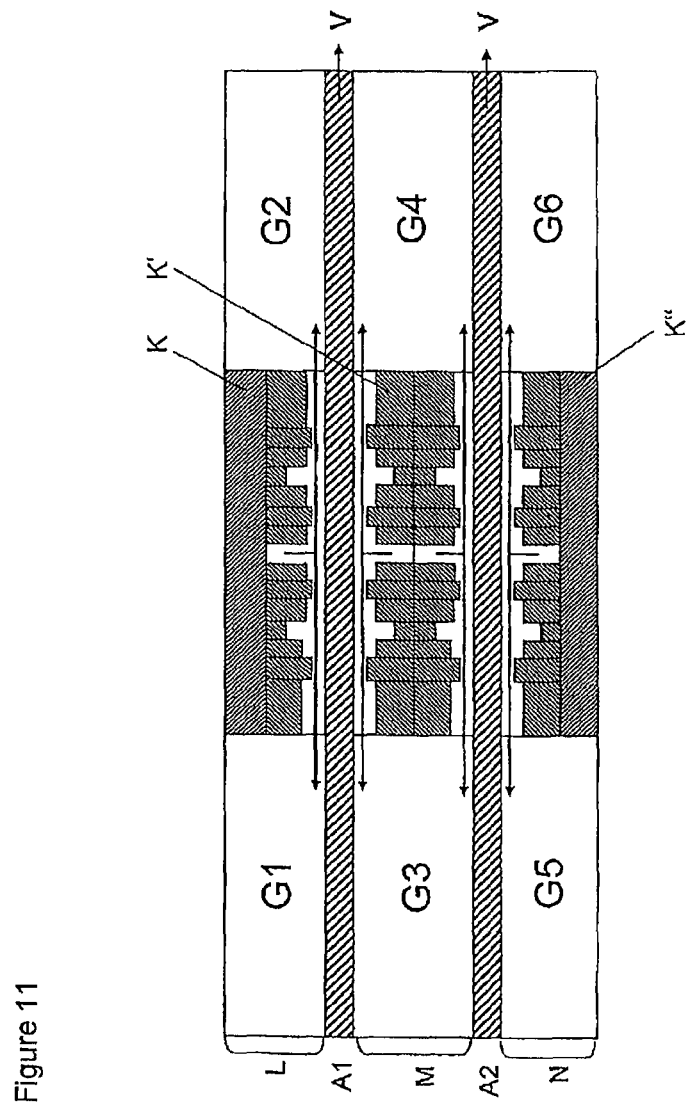
Figure 12:
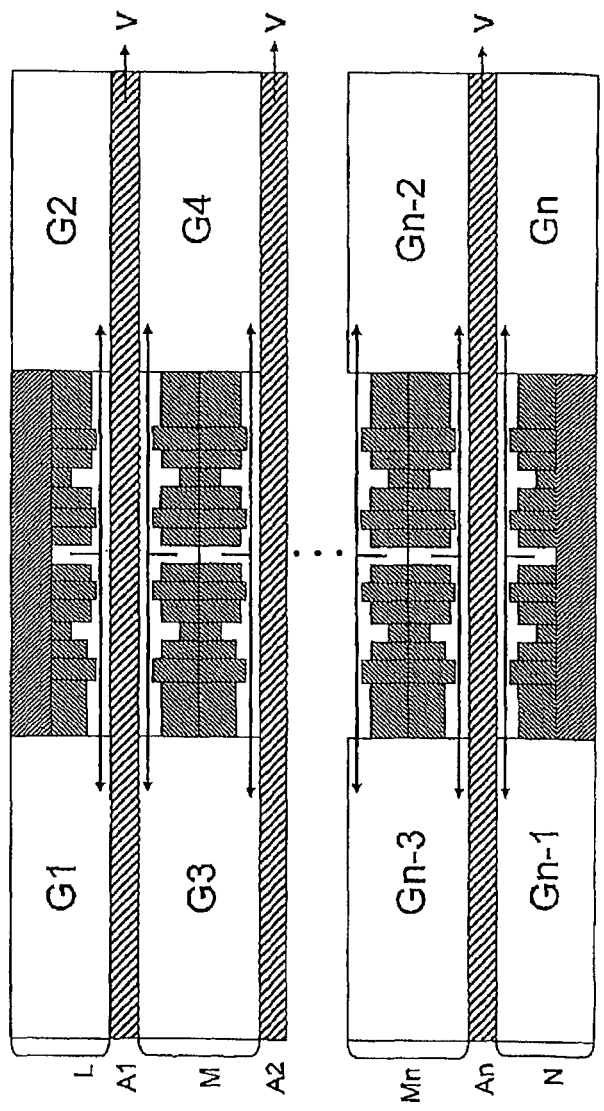
Figure 13:
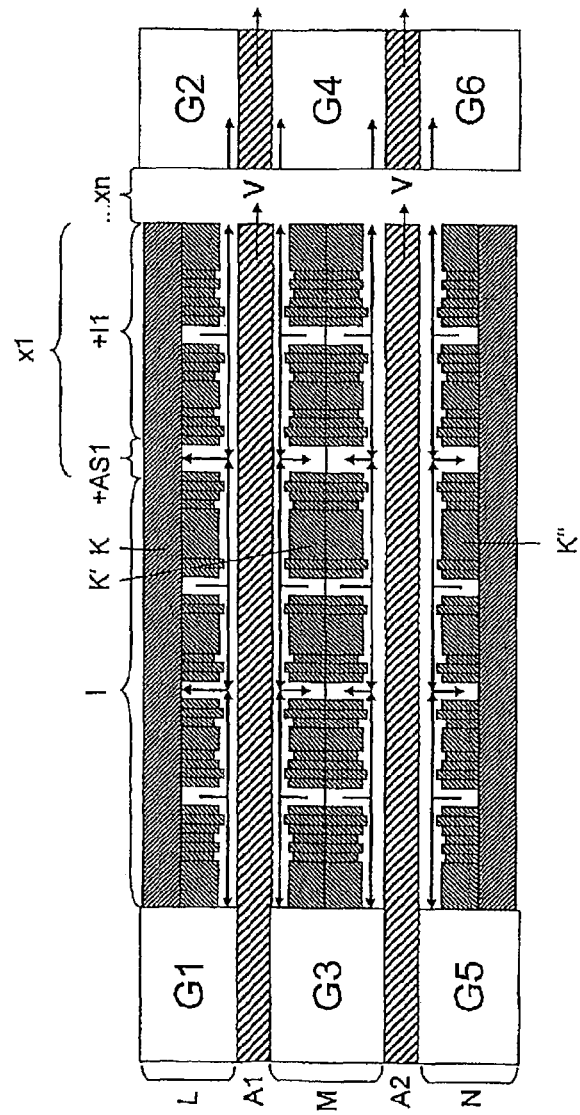
Figure 14:
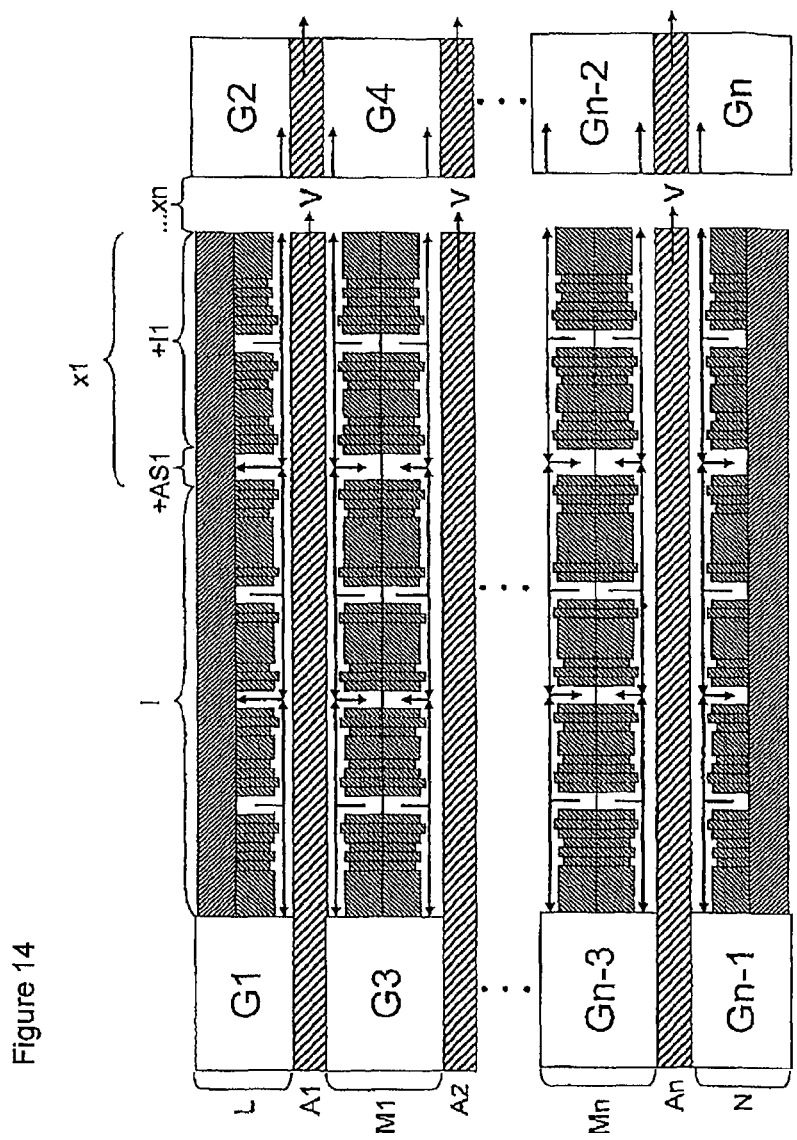
Figure 15:
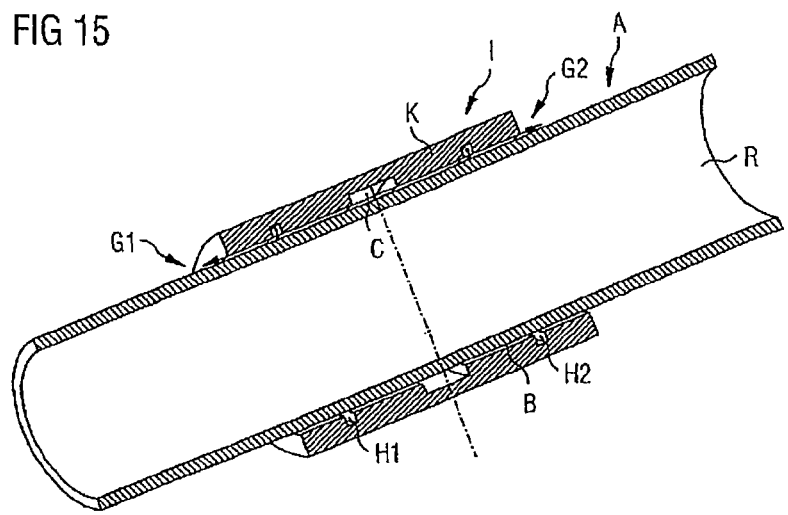
Figure 16:
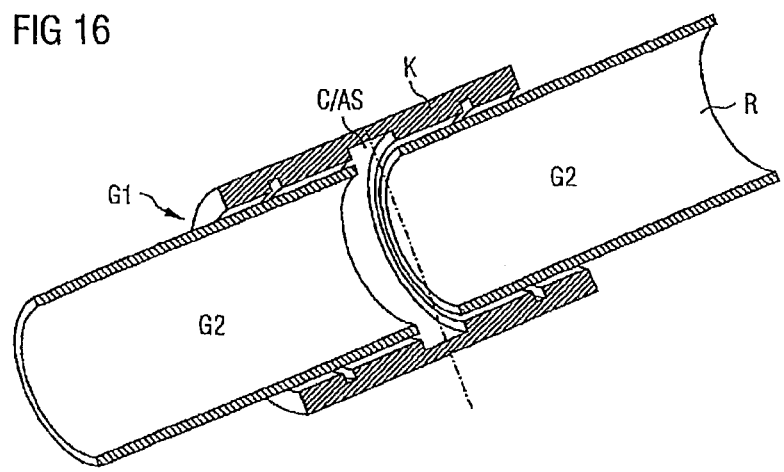

FIG. 1 shows a gas lock known from the prior art.
FIG. 2 shows a first embodiment according to the invention of a gas lock.
FIG. 3 shows the reverse concept from the embodiment according to FIG. 2.
FIG. 4 shows a combination of the measures that are represented in FIGS. 2 and 3.
FIG. 5 shows a form of a gas lock I, which is formed by two part-gas-locks GS1 and GS2.
FIG. 6 shows a form of a gas lock I, formed by two part-gas-locks GS1 and GS2, similarly formed according to any embodiment represented in the above figures, and comprise the flow breakers referred to above, in the form of elevations or recesses.
FIG. 7, shows a gas lock I.
FIG. 8, shows a further embodiment of the invention, a gas lock I.
FIG. 9, shows a further embodiment of the gas lock according to the invention.
FIG. 10, shows a further configuration of a gas lock I.
FIG. 11, shows a concept of a gas lock referred to in FIG. 9.
FIG. 12, shows the extension of the concept presented in FIG. 11.
FIG. 13, shows the transfer of the concept represented previously in FIG. 11.
FIG. 14, shows the gas lock with horizontal part-gas-locks arranged next to one another.
FIG. 15, shows a rotationally symmetrical form of the gas lock. FIG. 16, shows an embodiment in which the pipe R is interrupted in the middle of the inflow body K.
FIG. 17, shows a coating device according to the present invention.

SUMMARY OF THE INVENTION

Based on this, it is the object of the present invention to provide a gas lock which takes up minimal space and with which the separation of gases without contact with product/educt/transporting system can be made possible.

This object is achieved with respect to the gas lock by the features of patent claim 1. With patent claim 11, provision is made for a coating device according to the invention, which comprises a gas lock according to the invention. With patent claim 12, intended uses of the gas lock according to the invention are provided. The dependent claims represent advantageous developments.

According to the invention, provision is therefore made for a gas lock for separating two gas chambers, which comprises
a) at least one inflow body, which has at least one inlet passage for a gas, which opens out into a first side of the inflow body,
b) a wall which is arranged at a distance from the first side of the inflow body, wherein a gap, which is in fluid communication with the inlet passage, is formed between the wall and the inflow body.
c) at least two outflow openings for the gas, which are in fluid communication with the gap,
wherein in the first side, delimiting the inflow body, and/or in the side of the wall that is facing the first side of the inflow body there is at least one means for producing a turbulent flow in the gap (B).

The wall may be designed for example as a plate. It is also possible that the wall has a certain curvature, for example is the wall of a pipe. The inflow body is thereby preferably designed in the last-mentioned case such that its delimitation facing the gap is also curved, so that the gap has the same width at each point.

The wall in this case can also be designed so as to move with respect to the inflow body, so that, for example, the gap which exists between the inflow body and the wall can be varied in its dimension, for example can be made wider or narrower (vertical movability). For example, the wall in the form of a plate may be designed to be movable with respect to the inflow body; in the case where the inflow body is formed annularly around a pipe, the outer delimitation of the pipe representing the wall, it is also conceivable that the inflow body can be varied in its circumference by means of actuating elements for example, so that the width of the gap can be altered as a result.

Alternatively or in addition to this, it is also possible for the wall or plate to be designed to be movable with respect to the inflow body in a direction in which the width of the gap is not altered (horizontal movability). With such a configuration, the wall is designed to be movable in a direction which is offset by 90° in relation to the above-described vertical direction of movement.

Moreover, it is possible that the wall is of a continuous design, but there may also be interruptions in the wall.

The principle of the invention is therefore that
  at the points that are to be sealed, longitudinal gaps are created for example, and through these gaps there is fed an inert gas (or a gas that is non-critical for the process and the environment), which flows oppositely to the process gas or the ambient gas. The flow velocity or the partial pressure of the inert or non-critical gas is high enough in this case for a counter diffusion of the process gas or of the ambient gas over the length of the lock to be prevented within predetermined limits. The counter diffusion has an exponential curve, i.e. it can only be suppressed/reduced, but strictly speaking not "prevented". De facto, dilution ratios $>10^6$ are achieved (higher values are also possible), which in the technical sense "prevent" the outflow,
  as an option, further pressure measuring points, with which the outflow pressure from the lock can be controlled, are integrated at the respective end sections of the lock,
  as an option, it is possible for the gas lock to be of a duplex or multiplex design and to increase the separation effect by one or more suction devices being present.

According to the invention, it is thus provided that within the gap formed between the inflow body and the wall there is/are one or more means suitable for manipulating, for example vortexing, the flow of fluid within the gap that occurs during operation of the gas lock, i.e. suitable for example for producing a turbulent flow. These means are preferably passively designed, i.e. the flow occurring in the gap is preferably not influenced by active agitation of the means but by the cross section of the gap being varied in the direction of flow of the fluid and by locally different flow rates being produced, ultimately contributing to the vortexing of the fluid. These vortexing effects that are produced have a barrier effect for fluid flowing counter to the direction of flow, so that with the gas lock according to the invention an efficient and permanent separation of two gas chambers can be maintained during operation. In particular, the means for producing the turbulences may be designed for example as suitable internals, which produce for example a turbulent region with which pressure stages can be specifically established in the lock.

The at least one means may in this case be arranged in the first side of the inflow body or the side of the wall that is facing this side of the inflow body. It is also possible that means are arranged both in the inflow body and the wall.

Checking of the lock function is made possible by a check being carried out as to whether the outflow pressure of the inert gas or non-critical gas is higher than the pressure measured at the lock ends.

The gas lock according to the invention solves or overcomes all of the aforesaid problems a) to e). It constitutes the basis for plants of which the transporting system operates continuously and of which the gas chambers are separated from one another. The invention allows minimizing of the spatial extent of the gas lock. As a result, optimum process and safety control is provided. Furthermore, it is possible with the invention to install a plant which is operated continuously and/or operates with toxic and/or explosive gases in a normal operating environment. In this case, all safety-relevant criteria can be observed and the plant costs can be reduced.

In this case, it is preferred that the first side, delimiting the inflow body, and/or the side of the wall that is facing the first side of the inflow body has, as means for manipulation of the flow, at least one recess, preferably a plurality of recesses, extending from the first side of the inflow body and protruding into said body or extending from the side of the wall that is facing the first side of the inflow body and protruding into the wall. The recesses may be formed for example as depressions of the inflow body or in the wall.

Alternatively or in addition to this, the first side, delimiting the inflow body, and/or the side of the wall that is facing the first side of the inflow body may have, as means for producing a turbulent flow, at least one elevation, preferably a plurality of elevations, extending from the first side of the inflow body and protruding into the gap or extending from the side of the wall that is facing the first side of the inflow body and protruding into the gap. These elevations may be formed as a counterpart to the recesses referred to above.

As an option, flow traps (for example by means of grooves or recesses) or flow breakers (for example convexities), which can fluidically prevent a gas draw-back (for example as a result of jet effects) and consequently can reduce the necessary lock length, are thus created inside the gap of the lock. These two special configurations make it possible to produce vortexes within the gap when the inert gas flows through, so that an increase in efficiency of the barrier effect of the gas lock, and thus a shortening of the overall length, can be achieved.

In particular, it is advantageous if there is at least one recess and at least one elevation in combination with one another.

The gas lock may be constructed mirror-symmetrically with respect to the at least one inlet passage. A mirror-symmetrical form of the gas lock provides for example that the outflow openings are arranged such that the outflow direction of the first outflow opening is opposed to the outflow direction of the second outflow opening.

In a further preferred embodiment, the gas lock may be of a rotationally symmetrical form. In such an embodiment, the gas lock is arranged annularly around a cylindrical body. In this case, the surface of the cylindrical body serves as a wall. The cylindrical body may be, for example, a pipe, which is hollow inside. In this case there is formed between the wall and the inflow body an annular gap, which extends around the cylindrical body and through which the gas can flow.

It is also possible that the gas lock has both forms of symmetry, i.e. is formed both mirror-symmetrically, for example with respect to the measuring chamber, and rotationally symmetrically, i.e. for example on a pipe, the pipe surface serving as a wall.

It is also preferred that the gap extends essentially perpendicularly in relation to the at least one inlet passage. However, angled profiles are also conceivable.

In a special form of configuration of the gas lock it is provided that there is at least one possibility for the suction removal of gas. This can be arranged between two existing inflow passages, for example.

A preferred embodiment provides that in the first side, delimiting the inflow body, and/or in the side of the wall that is facing the first side of the inflow body it is possible for there to be at least one, preferably at least two measuring chambers for measuring at least one physical and/or chemical property of the gas (e.g. pressure and/or temperature or the chemical composition).

Furthermore, it is preferred that on the side of the wall that is facing away from the inflow body at least one further inflow body is arranged or a plurality of alternately arranged inflow bodies and walls are arranged. This embodiment provides that a division of the lock into multiple part-gas-locks can also be performed in the vertical direction.

According to the invention, a coating device or a heat treatment device, which comprises at least one previously described gas lock, is also claimed. The coating device in this case comprises two gas chambers, which are separated by the gas lock according to the invention, i.e. the gas lock is arranged between the gas chambers.

According to the invention, intended uses of the gas lock according to the invention are also specified. In particular, it is suitable for maintaining an existing concentration gradient of one and/or more gases and/or for maintaining a separation of different gases between two gas chambers.

DETAILED DESCRIPTION OF THE ILLUSTRATED EMBODIMENTS

The present invention is explained in more detail on the basis of the following figures, without restricting the invention to the special configurations that are represented.

In FIG. 1, a gas lock known from the prior art is represented. The gas lock I serves in this case for separating two gas chambers G1 and G2 and is to this extent arranged between these gas chambers. Comprised is an inflow body K, which has an inlet passage H arranged centrally in the inflow body K. Arranged opposite the inflow body K is a wall, formed as a plate A, so that a gap B is formed between the plate A and the inflow body K. The respective outflow openings, which are located at the outlets of the gas lock I in relation to the gas chambers G1 and G2, are denoted by i1 and i2. The inert gas/non-critical gas i1 or i2 flows toward the gas chambers G1 and G2. The respective gas pressures in the respective gas chambers G1 and G2 are denoted by P1 and P2. P3 is the pressure of the inert gas within the feedlines of the lock gas. The gas lock operates all the more effectively the higher P3 is in comparison with P1 and P2. As already indicated in the figure, this gas lock is operated in such a way that the pressure of the inflowing gas P3 must be greater than the pressures P1 and P2 prevailing in the respective gas chambers G1 and G2. This lock can only be operated very inexactly, since a very high pressure difference is required between P3 and P1 and/or P2 in order to maintain a material gradient of the gas composition in the chambers G1 and G2.

These fundamental points made in relation to FIG. 1 (for example the designations) also apply unrestrictedly to the embodiments according to the invention that are presented below.

FIGS. 2 to 16 all represent embodiments according to the invention of a gas lock.

A first embodiment according to the invention of a gas lock is represented in FIG. 2. This embodiment differs from the embodiment represented in FIG. 1 in that one or more recesses E (in the present case six) are additionally incorporated in the underside of the inflow body K, wherein these recesses flank the inflow passage H. These recesses E may for example take the form of notches or depressions on the surface of the inflow body K. In the case of a mirror-symmetrical form of the gas lock, the notches E are formed so as to extend parallel to one another, for example in the transverse direction in relation to the respective main directions of flow of the inert gas that are indicated by the arrows. The recesses E may be made both from the inflow body K and from the plate A (not represented). These act as flow traps and prevent gas from being returned under turbulent or critical operating conditions. In addition, such a construction allows the length of the lock (length of the gap B in the direction of the respective gas chambers G1 and G2) to be minimized.

In FIG. 3, the reverse concept from the embodiment according to FIG. 2 is represented. Instead of the recesses E that are represented in FIG. 2, the embodiment according to FIG. 3 has elevations F extending from the underside of the inflow body K and protruding into the gap B. This may take place both from the inflow body K and from the plate A. These elevations act as flow breakers and prevent gas from being returned under turbulent or critical operating conditions. In addition, such a construction allows the length of the lock to be minimized.

FIG. 4 concerns a combination of the measures that are represented in FIGS. 2 and 3. The gas lock I represented here has an inflow body K, which has both recesses E and elevations F. There is also the possibility that the recesses E and elevations F may be formed in the plate A (not represented).

A further form of a gas lock I, which is formed by two part-gas-locks GS1 and GS2, is set out in FIG. 5. These two part-gas-locks GS1 and GS2 are in this case formed essentially analogously to an individual gas lock according to an embodiment of FIG. 2 and are arranged in series with one another in order to form the gas lock I as a whole. However, this configuration of the two part-gas-locks GS1 and GS2 is only of an exemplary nature; these two part-gas-locks GS1 and GS2 may similarly be formed according to any embodiment represented in the above figures, and consequently also comprise the flow breakers referred to above, for example in the form of elevations or recesses. Such an embodiment, which goes back to the concept presented in FIG. 3, is represented in FIG. 6, while FIG. 7 shows a gas lock I which is formed by two part-gas-locks GS1 and GS2, wherein both elevations F and depressions E are present inside the gap B as means for producing turbulent flows. Provided between the two part-gas-locks GS1 and GS2 of the embodiments of FIGS. 5 to 7 there is a possibility for suction removal AS, by way of which the gas fed in can be removed. The two part-gas-locks GS1 and GS2 respectively have in this case separate gas feeds H1 (in the case of GS1) and H2 (in the case of GS2). During the operation of such a gas lock I, the following applies for the pressures that prevail in the respective regions of the gas lock or the two gas chambers G1 and G2: P3>P1, P3>P5, P4>P2 and P4>P5, the measuring points for the pressures in the gas lock I being provided with the encircled designations.

FIG. 8 represents a further embodiment of the invention, a gas lock I which comprises n part-gas-locks GS1, GS2, . . . , GSn arranged in series being represented here. A possibility for suction removal AS for gas is provided between each of the part-gas-locks that are present. The embodiment represented here represents the logical extension of the embodiments represented in FIG. 7 by n further part-gas-locks.

Represented in FIG. 9 is a further embodiment of the gas lock according to the invention, which, by contrast with the preceding embodiments of the gas lock, has two inlet bodies K and K' instead of a single inlet body, these inlet bodies being separated from one another by a plate A. The respective inlet passages H and H' in this case respectively open out in the direction of the plate A lying between the two inlet bodies K and K'. To this extent, this embodiment of the present invention concerns an embodiment according to FIG. 4 extended by a further inlet body. A corresponding extension, as represented here, is also possible however with the gas locks I represented in FIGS. 2 and 3. The two inlet bodies K and K' do not in this case have to be arranged symmetrically at a distance from the plate A, as represented in FIG. 13; an asymmetrical arrangement of the two inlet bodies K at a distance from the plate A is also possible. The other designations are taken from those of FIG. 4, those in the additional gas lock that is formed by the inflow body K' and the plate A being provided with an apostrophe. In this case, the plate A lying between the two inflow bodies K and K' may be movably formed. It may for example be guidable in a horizontally movable manner, as indicated on the right in the figure by v. In addition or alternatively to this, however, vertical movability of the plate A is also conceivable, so that for example the width of one of the two gaps B or B' is reduced to 0, and consequently one gas lock can be closed. It is possible by this gas lock that is represented in FIG. 9 for a total of four gas chambers G1 to G4 to be separated from one another. The corresponding pressure conditions that have to prevail during the operation of the gas lock are as already indicated in the preceding figures by the respective designations P1 to P6, the respective ideal pressures being represented in the figure.

The embodiment of the gas lock in which there are a number of inlet bodies K, K', ..., Kn can be transferred to any of the lock principles that are represented in FIGS. 1 to 8. FIG. 10 shows merely as an example of this a further configuration of a gas lock I according to the invention, which corresponds to a doubling of the gas lock that is represented in FIG. 8, wherein a further inflow body K' is formed with the corresponding configurations (i.e., for example, here too there are possibilities for suction removal, etc.). With respect to the principal components shown, reference is also made to the statements made with respect to FIG. 8. The plate A arranged between the two inflow bodies K and K' may be formed according to the embodiments of FIG. 9.

As explained in more detail in a special embodiment in FIG. 11, the concept of a gas lock referred to in FIG. 9, which has more than one inflow body K, can be extended as desired by a vertical dimension. Represented here is a gas lock I, which is constructed from three part-gas-locks L, M and N. The part-gas-lock L with an inflow body K is based on the embodiment that is represented in FIG. 4. For the sake of clarity, the designations are not specified in detail in this figure; the gas locks are in this case all formed in the way represented in FIG. 4. Likewise, with respect to the principles of the means for producing turbulences, it is also possible to refer back to the principles represented in FIGS. 2 and 3. The part-gas-lock L with the inflow body K is delimited by a movably arranged plate A1. The plate A1 is adjoined by the second part-gas-lock M, which is situated between the part-gas-locks L and N. This part-gas-lock is delimited on one side by the plate A1, on the other side by the plate A2. The plate A2 is in this case also movably formed, according to the representation in the figure in the horizontal direction. The inflow body K' of the part-gas-lock M is in this case formed such that it has outlet passages on both sides, i.e. outlet passages in the direction of the plate A1 and the plate A2. The part-gas-lock N is formed by an inflow body K'', which is formed mirror-symmetrically in relation to the first part-gas-lock L.

Finally, FIG. 12 shows the extension of the concept presented in FIG. 11 in the form of a multi-parallel multiplex lock for n movable plates A1 ... An. Instead of a single part-gas-lock M, which is contained between two terminating part-gas-locks L and N, as represented in FIG. 11, the embodiment according to FIG. 16 has n different part-gas-locks, which are respectively separated from one another by a plate A. The inflow bodies forming the part-gas-locks M1 ... Mn are in this case based on the inflow body K' of the part-gas-lock according to FIG. 11. This embodiment makes it possible for a total of up to G2n different gas chambers to be separated. The further details of such a multi-parallel multiplex lock, in particular with regard to the movability of the plates A, has already been described in detail in FIG. 11.

It goes without saying that there is also the possibility that the locks that are represented in FIGS. 11 and 12 are designed according to one of the embodiments that are represented in FIGS. 2 and 3.

In FIG. 13, the transfer of the concept represented previously in FIG. 11 to the embodiment according to FIG. 10 is represented. In other words, the gas lock I described in FIG. 10, which has n possibilities for suction removal AS, is supplemented in the vertical direction by a further, third part-gas-gas-lock N. With respect to further details, reference should be made to the statements made with respect to FIGS. 10 and 11, which also apply unrestrictedly to FIG. 13.

The concept of vertical extension of the gas lock that is represented in FIG. 12 can also be continued with the gas lock presented in FIG. 10 or 13. The gas lock represented here in FIG. 14 has horizontal part-gas-locks arranged next to one another, with possibilities for suction removal respectively lying in between, as well as n part-gas-locks arranged in the vertical direction with plates A respectively lying in between. The number of locks n in the horizontal direction and n in the vertical direction may in this case be the same or different. This is also valid for the embodiment according to FIG. 11.

With respect to all of the statements made above, the plate A may be arranged at a fixed distance with respect to the inflow body or the inflow bodies, but may also be movably formed, so that a variation of the gap width and/or a variation of the horizontal position of the wall in relation to the inflow body is possible.

FIG. 15 shows a rotationally symmetrical form of the gas lock. Here, the gas lock I is formed by a rotationally symmetrically formed inflow body K, which is arranged around a pipe R. In this case, the outer wall A of the pipe R serves as a wall or delimitation. The gap B is in this case formed by the surface A of the pipe R and the inner side of the inflow body K. Also in this way, a separation of the two gas pipes G1 and G2 represented here is possible. The possibility of a number of gas inlets C and a centrally arranged measuring chamber C as well as gas inlets H1 and H2 flanking the latter is indicated. In this respect, the embodiment according to FIG. 15 is both rotationally symmetrical (with respect to the center point of the pipe or of the inflow body K) and mirror-symmetrical with respect to the measuring chamber C. However, this embodiment merely represents an example of a rotationally symmetrical form of the gas lock arrangement; all other variants of the form of an inflow body K that are represented in FIGS. 2 to 15 also come into consideration for the inflow body K.

Represented in FIG. 16 is an embodiment in which the pipe R is interrupted approximately in the middle of the inflow body K. In the embodiment that is represented in FIG. 16, this interruption is level with the measuring chamber C or the possibility for suction removal AS. For this case, the gas chamber G2 lies inside the pipe R, it being possible for the gas chambers G1 and G2 to be arranged separately from one another. This can be accomplished for example by a closure of the pipe.

In the last two figures, the means for manipulation of the flows which are arranged in gap 3 are not represented for reasons of clarity.

FIG. 17 shows a coating device according to the present invention, in which a number of gas locks according to the invention are integrated. For reasons of clarity, the embodiments according to the invention of the gas locks are not represented in this case.

In a first embodiment, the coating device has two coating chambers G5 and G6, which respectively have a suction removal (indicated by the arrow). These coating chambers G5 and G6 may operate at the same pressure level, but do not have to. A longitudinal section through the coating device from the side is represented. G1, G2, G3 and G4 may in this case represent the environment, for which reason the following applies for the pressures:

$P(G1)=P(G2)=P(G3)=P(G4)$. $P(G5)$ may be greater than or less than $P(G1)$, $P(G2)$, $P(G3)$ or $P(G4)$. The same applies to $P(G6)$. In any event, the pressure in all four locks is greater than $P(G1)$, $P(G2)$, $P(G3)$, $P(G4)$, $P(G5)$ and $P(G6)$. Consequently, the gas chamber G5 and the gas chamber G6 are separated from the environment.

The substrate can thus be moved continuously through the plant (specifically without contact), without losing the gas separation of the chambers G5 and G6 (it does not however have to be moved continuously). In the case shown, the substrate would be coated on top and underneath (but it could also be coated on one side, for which the plant would only have to have the part above the substrate (coating on top) or below the substrate (coating underneath)).

In a second embodiment, however, it is also conceivable that a cylindrical substrate, for example a pipe, is passed through the coating device represented. In this case, the gas chambers G1 and G3, G2 and G4 as well as G5 and G6 are connected to one another; in this case, there are only two gas locks, which are formed cylindrically around the pipe.

In any event, the gas locks are, however, formed according to the invention, as described above.

What is claimed is:

1. A gas lock for separating two gas chambers, comprising
   a) at least one inflow body which has at least one inlet passage for a gas, which opens out into a first side of the inflow body,
   b) a wall which is arranged at a distance from the first side of the at least one inflow body, wherein a gap, which is in fluid communication with the inlet passage is formed between the wall and the at least one inflow body,
   c) at least two outflow openings for the gas, which are in fluid communication with the gap,
   wherein in the first side, delimiting the at least one inflow body, and/or in the side of the wall that is facing the first side of the inflow body there is at least one means for manipulation of the flow in the gap, wherein the means for manipulation of the flow in the gap is vertically movable with respect to the wall so that the gap can be made wider or narrower, wherein there is at least one configuration for the suction removal of gas.

2. The gas lock according to claim 1, wherein the first side, delimiting the at least one inflow body, and/or the side of the wall that is facing the first side of the inflow body has at least one recess extending from the first side of the inflow body and protruding into said body or extending from the side of the wall that is facing the first side of the inflow body and protruding into the wall.

3. The gas lock according to claim 1, wherein the first side, delimiting the at least one inflow body, and/or the side of the wall that is facing the first side of the inflow body has at least one elevation extending from the first side of the inflow body and protruding into the gap or extending from the side of the wall that is facing the first side of the inflow body and protruding into the gap.

4. The gas lock according to claim 2, wherein there is at least one elevation in combination with the at least one recess.

5. The gas lock according to claim 1, wherein it is constructed mirror-symmetrically with respect to the at least one inlet passage and/or rotationally symmetrically with respect to an axis extending parallel to the gas lock.

6. The gas lock according to claim 1, wherein the at least two outflow openings are arranged such that an outflow direction of a first outflow opening is opposed to an outflow direction of a second outflow opening.

7. The gas lock according to claim 1, wherein the gap extends perpendicularly in relation to the at least one inlet passage.

8. The gas lock according to claim 1, wherein the at least one inflow body has at least two inlet passages for a gas and the gap is in fluid communication with the at least two inlet passages, the at least one configuration for suction removal of gas is arranged between the at least two inlet passages.

9. A coating device or heat treatment device, comprising at least one gas lock according to claim 1.

10. A use of a gas lock according claim 1 for maintaining an existing concentration gradient of one and/or more gases and/or for maintaining a separation of different gases in the two gas chamber.

11. A gas lock for separating two gas chambers, comprising
    a) at least one inflow body which has at least one inlet passage for a gas, which opens out into a first side of the inflow body,
    b) a wall which is arranged at a distance from the first side of the at least one inflow body, wherein a gap, which is in fluid communication with the inlet passage is formed between the wall and the at least one inflow body,
    c) at least two outflow openings for the gas, which are in fluid communication with the gap,
    wherein the first side, delimiting the at least one inflow body, and/or in the side of the wall that is facing the first side of the inflow body there is at least one means for manipulation of the flow in the gap, and
    wherein on the side of the wall that is facing away from the inflow body
    a) at least one further inflow body is arranged or
    b) a plurality of alternately arranged inflow bodies and plates are arranged.

* * * * *